(12) United States Patent
Wicpalek et al.

(10) Patent No.: US 9,548,746 B2
(45) Date of Patent: Jan. 17, 2017

(54) COARSE TUNING SELECTION FOR PHASE LOCKED LOOPS

(71) Applicant: Intel IP Corporation, Santa Clara, CA (US)

(72) Inventors: Christian Wicpalek, Puchenau (AT); Herwig Dietl-Steinmaurer, Wels (AT)

(73) Assignee: Intel IP Corporation, Santa Clara, CA (US)

( * ) Notice: Subject to any disclaimer, the term of this patent is extended or adjusted under 35 U.S.C. 154(b) by 9 days.

(21) Appl. No.: 14/578,773

(22) Filed: Dec. 22, 2014

(65) Prior Publication Data

US 2016/0182065 A1    Jun. 23, 2016

(51) Int. Cl.
| | |
|---|---|
| H03L 7/06 | (2006.01) |
| H03L 7/099 | (2006.01) |
| H03L 7/085 | (2006.01) |
| H04L 7/033 | (2006.01) |
| H03L 7/10 | (2006.01) |

(52) U.S. Cl.
CPC .............. *H03L 7/099* (2013.01); *H03L 7/085* (2013.01); *H03L 7/104* (2013.01); *H04L 7/033* (2013.01); *H03L 2207/06* (2013.01)

(58) Field of Classification Search
CPC .......... H03L 7/099; H03L 7/18; H03B 5/1228; H03B 5/1212
See application file for complete search history.

(56) References Cited

U.S. PATENT DOCUMENTS

| | | |
|---|---|---|
| 5,182,528 A | 1/1993 | Zuta |
| 5,379,002 A | 1/1995 | Jokura |
| 5,691,669 A | 11/1997 | Tsai et al. |
| 8,115,558 B2 | 2/2012 | Tsuda et al. |
| 8,169,270 B2 | 5/2012 | Zeng et al. |
| 8,264,258 B1 | 9/2012 | Chen |
| 8,432,204 B1 | 4/2013 | Chern et al. |
| 2006/0104398 A1 | 5/2006 | Su et al. |
| 2007/0182494 A1 | 8/2007 | Talwalkar |

(Continued)

FOREIGN PATENT DOCUMENTS

TW      201206085 A      2/2012

OTHER PUBLICATIONS

Chen, et al. "A 9 GHz Dual-Mode Digitally Controlled Oscillator for GSM/UMTS Transceivers in 65 nm CMOS." IEEE Asian Solid-State Circuits Conference, Jeju, Korea, Nov. 12-14, 2007.

(Continued)

*Primary Examiner* — Sibin Chen
(74) *Attorney, Agent, or Firm* — Eschweiler & Associates, LLC

(57) ABSTRACT

A phase locked loop system comprises a phase locked loop and an oscillator that is coarse tuned and fine tuned according to coarse tuning operations and fine tuning operations. The system operates to calibrate the coarse tuning of the oscillator based on one or more characteristics related to the oscillator and determined by a characterization component, an interpolation function and one or more final measurements. An adjustment component is configured to adjust the coarse tuning value based on at least one final frequency measurement to generate a final coarse tuning value and set the coarse tuning of the oscillator based on the final coarse tuning value.

25 Claims, 9 Drawing Sheets

(56) References Cited

U.S. PATENT DOCUMENTS

2010/0283551 A1* 11/2010 Zeng .................... H03B 5/1228
                                                                  331/117 FE

OTHER PUBLICATIONS

Staszewski, et al. "Digitally Controlled Oscillator (DCO)-Based Architecture for RF Frequency Synthesis in a Deep-Submicrometer CMOS Process." IEEE Transactions on Circuits and Systems—II: Analog and Digital Signal Processing, Vol. 50, No. 11, Nov. 2003.
Dunning, et al. "An All-Digital Phase-Locked Loop with 50-Cycle Lock Time Suitable for High-Performance Microprocessors." IEEE Journal of Solid-State Circuits, Vol. 30, No. 4, Apr. 1995.
European Search Report Dated Jul. 8, 2016 EP 15 19 5265.

* cited by examiner

COARSE TUNING SELECTION FOR PHASE LOCKED LOOPS

BACKGROUND

Phase locked loops (PLLs) can provide precise generation and alignment of timing for a wide variety of applications, such as for clock generation or clock data recovery. Digital phase-locked loops (DPLLs) are a viable alternative to traditional PLLs, in which a digital loop filter can be utilized to replace analog components. For example, all-digital phase locked loops (ADPLLs) are designed to utilize digital techniques throughout and can comprise a phase frequency detector, a loop filter, an oscillator, and a frequency divider. ADPLLs, as with other DPLLs, utilize a high-frequency clock source because they do not provide a true frequency synthesis. The oscillator is thus an important component involved in tuning the DPLL, which can involve coarse tuning and fine tuning operations. For example, the oscillator can be controlled by one or more varactor fields such as one varactor field for open loop band adjustment and another varactor field for closed loop tuning. For example, a coarse tuning (e.g., tuning a varactor field for a band adjustment) can be implemented with a capacitor that is controlled by a binary coding, in which the coarse tuning process selects a frequency band. However, coarse tuning alone can provide for an inaccurate and unstable phase lock for high-frequency applications. During the locking operation phase for a target frequency of operation and after coarse tuning, the coarse tuning is kept constant and the frequency resolution of the phase locked loop is enhanced with a fine tuning operation (e.g., setting a tuning field for locking the phase locked loop) in order to compensate for the error in the coarse tuning and to lock the oscillator at the target frequency. Therefore, the coarse tuning process should be accurate as possible to achieve scalability, high performance and a wide operating range.

DETAILED DESCRIPTION

Figure 1:
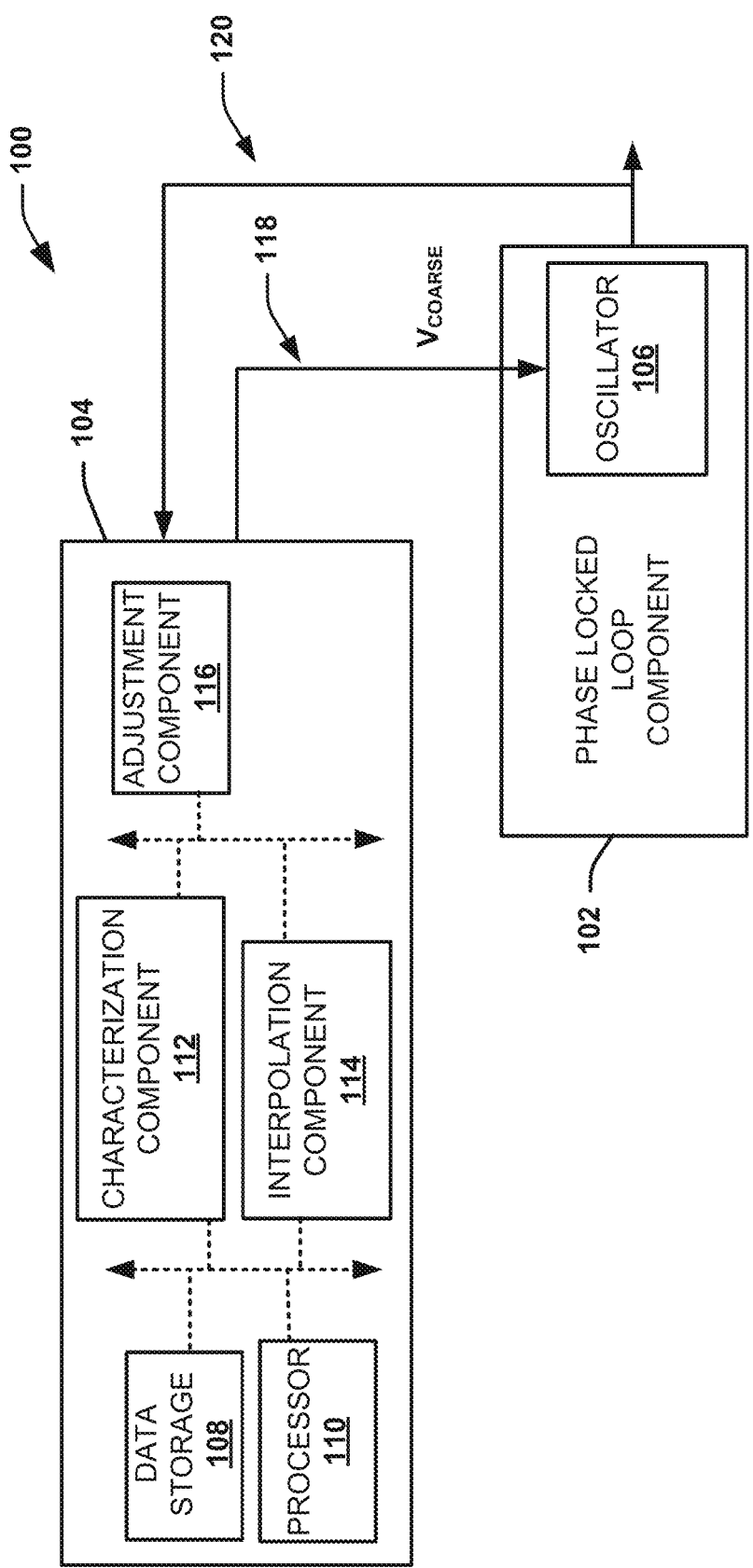
FIG. 1 illustrates an exemplary phase locked loop system in accordance with various aspects described.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a circuit, a processor, a process running on a processor, a controller, an object, an executable, a program, a storage device, and/or a computer with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies and continued objectives, various aspects for PLLs including a frequency coarse tuning are disclosed by utilizing different coarse tuning selection processes and components. System components of a PLL enable a majority of the coarse tuning process to be performed in an open loop configuration or operational state that is before the DPLL is locked or latched for generating a uniform or consistent output as a function of the inputs, such as for frequency synthesis, demodulation, phase modulation or synchronization applications. For example, a characterization component generates a characterization of an oscillator in the PLL during a first phase of operation (e.g., a boot-up phase that is before a locking state of the PLL).

As used herein, "boot-up phase" can refer to the initialization or initial beginning of powering up a phase locked loop, which is also considered a "non-time critical phase" of operation before the phase locked loop is locked for an active operation. The phrase "time-critical phase" refers to a phase of operation of the phase locked loop that is also before a locking condition of the phase locked loop, but follows after the "boot-up phase," in which a complete powering of the phase locked loop has occurred. The "time-critical phase" can also be referred to as "a start-up phase," or "a full powering phase," in which time is more critical than at the boot-up phase of operation (non-time critical phase).

The characterization component, for example, operates to determine characteristics related to the oscillator for coarse tuning operations to generate a tuning value for the tuning field for frequency band adjustment during the non-time critical phase. Alternatively or additionally, the characterization of the oscillator can be performed externally and characteristics related to the oscillator for coarse tuning processes can be stored in a memory of the system or PLL device. The characterization process determines characteristics related to the oscillator or an oscillator characteristic profile of the characteristics that can include one or more of a frequency measurement sample, a phase sampling, identification of any process variations, voltage variations, temperature variations, gains, step sizes or other characteristics or operating parameters related to the oscillator.

An interpolation process, via an interpolation component, is further performed based on the oscillator profile, such as the characteristics or the operating parameters of the oscillator. The interpolation component generates an interpolation of the characteristics to determine a coarse tuning value for the oscillator.

In addition, an adjustment component generates a final adjusting and is supported by a measuring process to generate a final coarse tuning value or function for finalizing the coarse tuning process, which can be performed during the time critical phase of operation, for example. The coarse tuning processes disclosed herein can be performed in conjunction with a fine tuning phase that is implemented after the coarse tuning phase of operation for these processes.

A phase locked loop component can be a phase locked loop, PLL device or control system that generates an output signal with a phase that is related to the phase of an input signal based on an oscillator or an oscillator circuit. The coarse tuning processes and components disclosed can operate with oscillators, such as a digital controlled oscillator (DCO), a voltage controlled oscillator (VCO) or the like, for example, for multiple different frequency synthesizing operations. The phase locked loop systems discussed can operate to synthesize or synchronize signals, which can track an input frequency or phase and generate a frequency or phase that is a multiple of the input frequency. The phase locked loop can be locked, in a locked state or a locked condition in response to the input and output frequencies being operationally set to be approximately the same or at least behave proportionally with respect to one another, in which the feedback loop of the phase locked loop is closed. Consequently, the design of phase locked loop systems can be challenging due to specifications for small integrated phase noise, fast setting time, small spur levels, and low power consumption, for example. Additionally, the challenge increases due to increased process, voltage, or temperature (PVT) variations in scaled, fabrication processes for electronic devices. For example, the designed frequency tuning range of the oscillator is typically specified to be wider than the specifications for manufacture in order to overcome these PVT variations.

An example phase locked loop system comprises the characterization component, discussed above, which is configured to determine characteristics (e.g., properties, behaviors, criteria, etc.) that are related to an oscillator of a phase locked loop. An interpolation component generates an interpolation of the oscillator characteristics to determine a coarse tuning value or a coarse tuning function that is configured to generate a coarse tuning, or set a tuning field, for band adjustment of the oscillator. An adjustment component is configured to adjust the coarse tuning value based on at least one final frequency measurement to generate a final coarse tuning value and set the coarse tuning of the oscillator based on the final coarse tuning value. These components (the characterization component, the interpolation component, and the adjustment component) operate for coarse tuning before the locking of the phase locked loop. In one example, the characterization component can operate during the non-time critical phase of operation, while the interpolation component and the adjustment component can operate during the time-critical phase of operation. Additional aspects and details of the disclosure are further described below with reference to figures.

FIG. 1 illustrates an example phase locked loop system that operates to control and set the coarse tuning of an oscillator of a PLL according to various aspects. The phase locked loop system 100 comprises a phase locked loop component 102 and a coarse tuning component 104 that operates to set the coarse tuning values of an oscillator or oscillator component 106 of the phase locked loop system. The phase locked loop component 102 can comprise PLL, a DPLL, an ADPLL, or other PLL that operates to generate a frequency, for example, to synthesize, recover, demodulate, stabilize, or distribute a time pulse for signals in one or more circuits such as a microprocessor or other electronic devices. The phase locked loop component 102 is configured to modify, adjust or set a locked frequency for a locked phase according to a fine tuning path of the system and a coarse tuning path 118 of the system, which operate according to one or more components (e.g., coarse tuning components) to tune or select a frequency or a phase of operation for a locked state and further enable a wide tuning range to be obtained in the oscillator component 106.

As a part of the phase locked loop system 100, the phase locked loop component 102 is coupled to a coarse tuning component 104. The coarse tuning component 104 operates to generate a coarse tuning word or a coarse tuning signal (e.g., an analog or a digital signal) that sets a coarse tuning of a frequency or a phase of operation in the oscillator component 106 of the phase locked loop component. The coarse tuning component 104, for example, generates a coarse tuning signal $V_{COARSE}$ that is provided to the oscillator component 106 of the phase locked loop 102 via a coarse tuning path 118. The oscillator component 106, for example, can comprise a digital controlled oscillator (DCO), a voltage controlled oscillator (VCO) or any oscillator configured to be operate as a function of a coarse tuning operation or process. In a closed loop operation (a locked state or locked condition of a PLL) of a VCO, for example, the oscillator component 106 is controlled via an analog signal, in which before the loop is closed (before the PLL device is locked or fixed into a locked state) a band (e.g., frequency band) is selected according to an adjustment by the coarse tuning signal from the coarse tuning component 104. In a closed loop operation of a DCO, for example, the operation of the oscillator component 106 is controlled by a digital tuning value, word or signal with a set of data bits, in which before the loop is closed, the band is selected according to an adjustment by the coarse tuning signal (e.g., $V_{COARSE}$) from the coarse tuning component 104. The oscillator component 106 can comprise any oscillator that is configured to operate based on a coarse tuning operation and be coarse tuned according to a coarse tuning value, a coarse tuning setting, a coarse tuning function, a coarse tuning signal/word or the like, which can be collectively referred to as a coarse tuning value.

The coarse tuning component 104 is configured to facilitate a coarse tuning operation of the oscillator component 106 as a function of a characterization, an interpolation and an adjustment process during the open loop state of the phase locked loop component 102, or, in other words, before the phase locked loop component 102 is locked via a digital fine tuning word or an analog control signal (referred to collectively as a fine tuning operation that tunes a field for locking the PLL). The coarse tuning operation via the coarse tuning component 104 can be performed as fast as possible (e.g., faster than a successive approximation process or other coarse tuning processes), and cope with different oscillator characteristics or properties of the oscillator with high accuracy.

The coarse tuning component 104 comprises a data storage 108 (e.g., one or more memories, data bases, data store(s), etc.) and a processor 110 that is coupled to the data storage 108 and can confer functionally or operate to provide one or more processing signals or data to components of the system 100 or other components of systems discussed herein. The coarse tuning component 104 further comprises a characterization component 112, an interpolation component 114 and an adjustment component 116.

The characterization component 112 is configured to monitor and analyze the oscillator component 106 and determine related characteristics from the analysis. The characterization component 112 can determine a characteristic profile (e.g., a behavior profile) having characteristics that are related to the oscillator component 106. The characteristics or parameters, for example, can include any type of oscillator (e.g., a VCO or a DCO) characteristics, as well as frequency measurements that are generated during a particular phase of operation of the phase locked loop component 102, which is before a locking phase or before a closed loop configuration is implemented. In addition or alternatively, the characteristics can be determined externally to the system and stored in a memory of the data storage 108, for example.

The characterization component 112 is configured to determine characteristics related to the oscillator component 106, which can include initial frequency measurements of the oscillator component 106, an approximation of a coarse tuning curve with respect to the frequency measurements and a range of coarse tuning values, a coarse tuning step size or step size value from one point on the coarse tuning curve to another, a plurality of interpolation coefficients based on the coarse tuning curve, defined regions of overlap or crossovers (e.g., where curve portions overlap or mismatch), or other characteristics related to the oscillator component 106. In addition or alternatively, interpolation coefficients can be determined externally and stored in the data storage 108, for example.

In addition to the characteristics discussed above, other characteristics related to the oscillator can include differential nonlinearities of the output of the phase locked loop component, or operation processes, such as PVT variations, offsets or effects generated, which can offset processing operations by causing errors that are not initially identified or have yet occurred. Other characteristics that can be identified by the characterization component 112 can be related to other components or be at different phases of operation such as frequency values after initial operation or boot-up, frequency values or sample measurement at other times of operation, frequency ranges, coarse tuning values, coarse tuning ranges, interpolation coefficients (e.g., polynomial coefficients of an approximated coarse tuning curve based on initial frequency measurements), overlapping values, overlapping coarse tuning curve points, a number of overlapping regions or nodes of the curve, in which overlaps can be detected based on techniques utilizing one or more of these characteristics related to the oscillator.

In one aspect, the characterization component 112 can perform a characteristic determination during a non-time critical phase of operation of the oscillator in an open loop configuration, or in a configuration where the phase locked loop component 102 has not yet been generated into a closed loop configuration that locks the frequency or phase for continued or active operation of the device or system 100. The characterization component 112 can operate, for example, during a non-time critical phase of operation, or at least during a phase before a locking of the phase locked loop component 102 to determine a polynomial approximation of a coarse tuning curve based on determined oscillator characteristics. The polynomial of the coarse tuning curve can be approximated based on a polynomial approximation process, such as, for example, a least squares polynomial approximation, a piecewise polynomial approximation process, or another approximation process. The characterization component 112 is configured to facilitate an approximation of a coarse tuning curve that can be derived from one or more initial frequency measurements of the oscillator component 106, which are determined during a non-time critical phase of operation of the phase locked loop component 102 or before a locking of the phase locked loop component 102. The characterization component 112 enables the interpolation component 114 to further generate an approximation of a coarse tuning curve with respect to the frequency measurements along a first axis and with one or more coarse tuning values along a different axis. The characterization component 112 can further analyze the curve and generate an oscillator profile that describes the behavior of the oscillator with one or more characteristics from the curve, as well as other oscillator characteristics that can be utilized in subsequent processes in different phases of operation. Other oscillator characteristics can comprise an initial set of interpolation coefficients that can be used in subsequent interpolations after the powering up phase and via other components of the system, or other characteristics, parameters, properties or values related to an oscillator of the oscillator component 106 as discussed herein.

The characterization component 112 generates polynomial coefficients for an approximation of a coarse tuning curve based on initial frequency measurements. For example, the characterization component 112 generates one or more interpolation coefficients and further provides or stores the coefficients in data storage 108 for later interpolation via the interpolation component 114. In order to enable a proper approximation of the coarse tuning curve, the frequency of the oscillator component 106 is measured by the characterization component 112 at coarse tuning supporting points (e.g., at desired operating points, certain frequencies values corresponding to one or more coarse tuning supporting points, etc.). The interpolation coefficients can then be calculated according to these measurement results during a point in time or a period where the execution timing of the system 100 or the phase locked loop component 102 is not time critical, such as before the locking phase, in a boot-up phase, a non-time critical phase operation of the phase locked loop component 102, for example.

The interpolation component 114 is configured to generate an interpolation based on the characteristics determined via the characterization component 112. The interpolation component 114 can operate to generate additional interpolation(s) that are a function of a target frequency with respect to the characteristics determined in order to facilitate the generation of a coarse tuning value (e.g., an initial coarse tuning value, an initial coarse tuning function or initial coarse tuning operation). For example, a coarse tuning interpolation curve based on the coefficients and the measurement results of the characterization process can be generated. The interpolation process(es) can comprise a Lagrange interpolation, for example, or a different interpolation. For example, the interpolation component 114 can generate an interpolation process that is based on one or more coefficients previously defined by a characterization process or other processes in a non-time critical phase of operation or before a locking of the phase locked loop.

In one example, the interpolation component 114 can operate to facilitate a determination of a coarse tuning value that sets a coarse tuning of the phase locked loop component 102 with the oscillator component 106. This coarse tuning value can be an initial coarse tuning value that can operate to set the coarse tuning of a tuning field of the oscillator component 106, which is further received by the adjustment component 116 for further modification or processing based on a coarse tuning selection process. Thus, the interpolation process that is generated by the interpolation component 114 comprises a determination of the coarse tuning value (as an initial coarse tuning value), which is based on the characteristics that include one or more initial frequency measurements and the polynomial coefficients from the characterization component 112. The interpolation process of the interpolation component 114 can be performed during a phase of operation before a PLL locking phase where the PLL is in an open loop configuration. The phase locked loop component 102 is locked into a target frequency, for example, when a feedback path becomes closed and approximately equivalent to an input frequency at an input terminal of the phase locked loop component 102. The interpolation component 114 further generates the interpolation as a function of the plurality of coefficients, which is determined by or derived from the characteristics determined from the approximation of a coarse tuning curve with respect to a frequency of the oscillator for a set of coarse tuning supporting points.

The adjustment component 116 is configured to adjust the initial coarse tuning value to further generate a final coarse tuning value. The adjustment component 116 is further configured to set the coarse tuning of the oscillator component 106 based on the final coarse tuning correctional value and provide the final coarse tuning correctional value to set the coarse tuning (as a final coarse tuning value) of the oscillator component 106 via a coarse tuning control path 118 for implementing a final target frequency.

In one embodiment, the adjustment component 116 further operates to determine additional frequency measurements before the phase locked loop is locked. The adjustment component 116 can operate, for example, during a full powering phase that occurs at a phase before the phase locked loop becomes locked in a closed loop configuration for an active operation. The additional frequency measurements can be determined based on a measurement of the feedback path 120 from the output of the phase locked loop component 102. The additional frequency measurements further enable the determination of a correctional value and a derivation of a final coarse tuning correctional value, which is derived from a difference of the final frequency measurement and the final target frequency.

In another aspect of the adjustment component 116, one or more final frequency measurements can be identified in response to the detection of an overlap. An overlap can occur to account for gaps or mismatches within the system or device design and can be detected within regions of the coarse tuning curve that overlap one another, which is further illustrated, for example, in FIG. 7, described infra. These overlaps can operate to decrease the performance of the locking or coarse tuning processes for the oscillator component 106, for example, if the overlaps have not been characterized or considered in the characterization component 112 or the interpolation component 114. As such, the initial or set value for coarse tuning is not always able to fully tune the oscillator with a desired accuracy or a desired level of resolution. Thus, the adjustment component 116 is configured to identify overlaps within the oscillator behavior patterns or oscillator profile, and determine the additional frequency measurements of the oscillator component 106 to adjust the coarse tuning value in order to eliminate the remaining frequency error In another aspect, a second final frequency measurement or more subsequent final frequency measurements can be generated via the adjustment component 116 in response to a detection of an overlap occurring in the frequency measurements or coarse tuning approximation curve. The overlaps can be detected, for example, from a logic operation of the bits that derive the coarse tuning value (e.g., a coarse tuning word). Such overlaps can be detected from a degree or level of interpolation error from the interpolation processes of the interpolation component 114. For example, after the characterization processes of the characterization component 112 and the interpolation processes, a frequency error between an actual oscillator frequency and a final target frequency could still be present. This frequency error can be caused by a time difference in combination with a temperature drive or variation between characterization processes or operations during the non-time critical phase of operation and a powering of the phase locked loop component 102. In another example, frequency offsets or errors can also result from a difference of an approximated and a real/actual oscillator characteristic. Oscillator component 106 characteristics are not always monotonic in nature and demonstrate a differential nonlinearity, for example, in which these characteristic behaviors are not always considered during characterization and interpolation process alone or in the operation phases of the characterization component 112 or the interpolation component 114 alone. The adjustment component 116 is configured thus to adjust the coarse tuning value or function with additional frequency measurements in one or more subsequent iterations of an adjustment process implemented via the adjustment component 116 to generate the final coarse tuning value to set the coarse tuning of the oscillator component (e.g., a DCO or a VCO).

In one aspect, the operations of the components can operate in a phase of operation before a locked state of the phase locked loop component. In other examples, the characterization component 112 can operate in a non-time critical phase of operation during a boot-up phase of the phase locked loop component, while the interpolation component 114 and adjustment processes of the adjustment component 116 are performed in a time critical phase (e.g., a full powering phase or start-up phase) that is more time critical than the non-time critical phase and performed during further powering or start-up before the locking phase of the phase locked loop. Alternatively, the characterization component 112, the interpolation component 114 and the adjustment component 116 can occur in the non-time critical phase, a time critical phase or a combination thereof.

Advantages of coarse tuning component 104 being described, include faster processes for calibrating or settling in the coarse tuning compared to successive approximation approaches because less frequency measurements can be used (e.g., two or less, for example) before the phase locked loop locking for a locked state or condition of the PLL. A fast phase locked loop settling time enables specifications to be satisfied with all Long-Term Evolution (LTE) and LTE carrier aggregation (LTE CA) operations, and especially for LTE Time-Division Duplex (LTE TDD) operations. In addition, time consuming components or processes can be performed during the chip booting phase or other non-time critical phase of operation. The boot-up phase, for example, is not as time critical as compared to the locking phase of the phase locked loop component 102.

Figure 2:
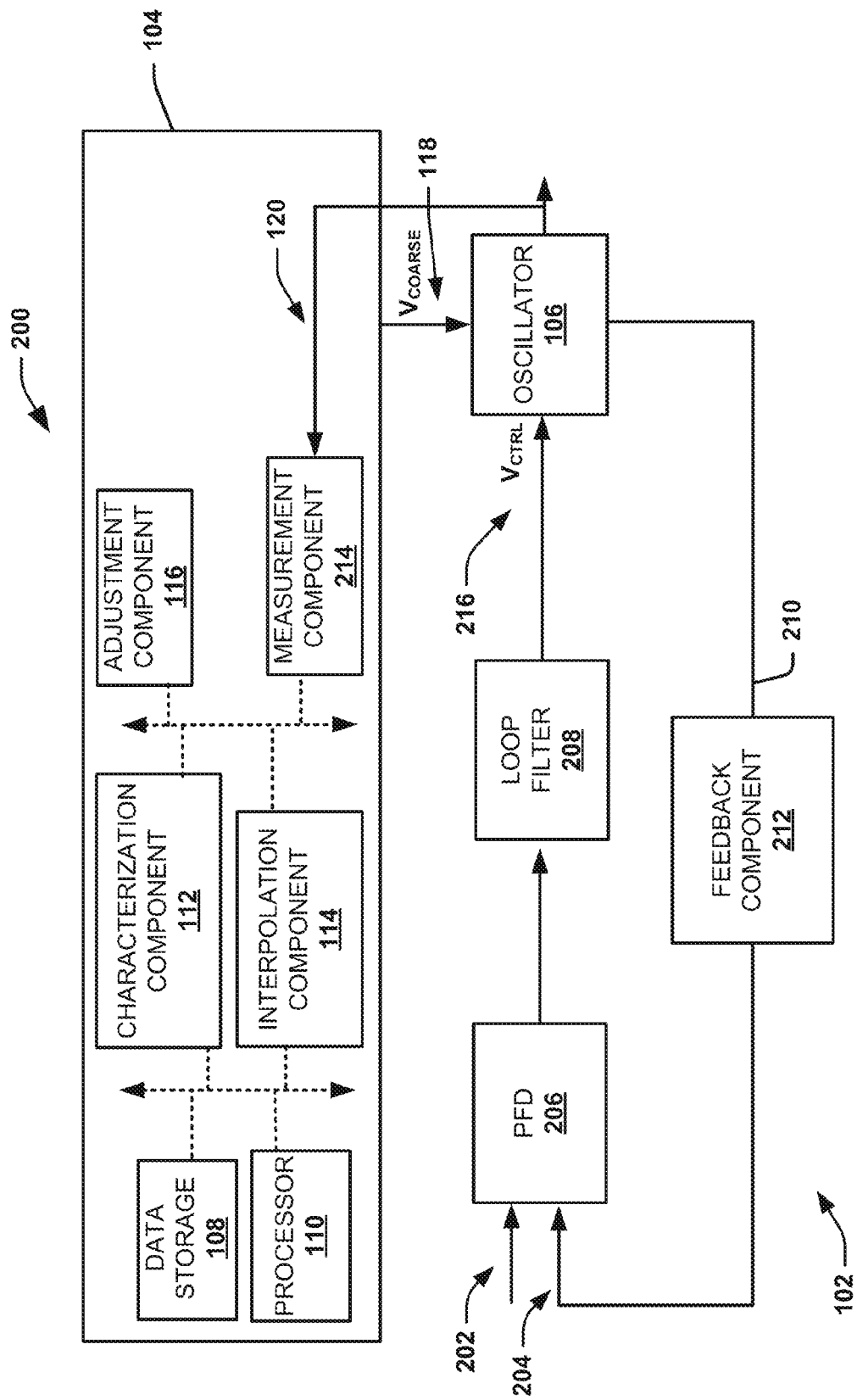
FIG. 2 illustrates another exemplary phase locked loop system in accordance with various aspects described.

Referring now to FIG. 2, illustrated is an exemplary configuration of the phase locked loop component 102 of a system for coarse tuning calibration in accord with various aspects that are being described. The system 200 comprises similar components as discussed above, and further comprises a phase-frequency detector 206, a loop filter 208 and a feedback component 212 that operate to generate a frequency acquisition as a phase locked loop, for example, with an oscillator 106 that can be tuned or set according to a coarse tuning operation or value and a fine tuning operation or value.

The phase-frequency detector 206, for example, can operate as an error detector, which can also include a charge pump (not shown). The phase-frequency detector 206 can operate to determine a phase or a frequency error in the phase locked loop component 102 based on a reference input signal and a feedback signal 204 via a feedback path 210, which can further include a feedback component 212. The feedback component 212, for example, can be a divider or other component that multiplies the feedback signal by a multiple to control an error differential by a closed loop configuration of the feedback path 210. The phase-frequency detector 206 can operate to compare the phase or frequency of the two input signals, in which the feedback signal 204 can be from a VCO, DCO, or other oscillator component 106 that is configured to operate based on a coarse tuning signal, a coarse tuning word or a coarse tuning operation and a fine tuning operation. The input signal 202, for example, can be a reference signal that is provided via an external source, a data store, other device or system component that is operably coupled to the phase locked loop component 102. The phase-frequency detector 206 can further comprise an output, which can facilitate subsequent circuit components to adjust the differences in order to lock onto the phase in the locked state or locked condition of the phase locked loop component 102.

The phase-frequency detector 206 is further coupled to the loop filter 208, which operates to integrate the received signal to smooth or filter it, and then feed the integrated smoothed output to the oscillator component 106 as a fine tuning control signal 216 or $V_{CTRL}$ during a locking process for setting the oscillator in a locked state or condition. In one example, the oscillator can be a VCO or a DCO. The settling time for the locking phase of operation to achieve a locking state or condition can be timing critical to determine the correct coarse tuning value that generates an appropriate oscillator output frequency via the coarse tuning control path 118. Thus, to decrease the settling time, the system 200 further operates to determine characteristics of the oscillator and perform various calculations as pre-calculations to an extent that is possible during the non-time critical phase of operation, such as during a boot-up phase.

In one example, the adjustment component 116 is configured to adjust the coarse tuning value generated via the interpolation component 114. For example, the adjustment component 116 can be coupled to a measurement component 214 such as a frequency detector or other component that generates at least one additional frequency measurement based on a frequency offset (error) that can occur from a time difference in combination with a temperature drift or other PVT variation. The measurement component 214 measures additional frequency measurements from the output of the oscillator via the feedback measurement path 120 in order to determine offsets or errors. Frequency errors can also result from a difference between the approximated and an actual or real oscillator characteristic. The offsets can occur, for example, during a period between the characterization processes generated by the characterization component 112 in a non-time critical phase of operation and an active phase/time critical phase of operation. As such, the measurement component 214 can further facilitate faster settling times in the locking of the phase locked loop 102 by generating at least one additional frequency measurement before a locking of the phase locked loop component 102. Additionally or alternatively, the measurement component 214 can operate after a boot-up phase during a powering phase or a time-critical phase of operation of the phase locked loop component 102 that is before the locking of the phase locked loop component 102. The measurement component 214 enables the adjustment component 116 to determine the frequency error or offset to further compensate for such error within the final coarse tuning value or coarse tuning signal provided to the oscillator component 106 for locking of the oscillator component 106.

Alternatively or additionally, the frequency error determined by the measurement component 214 can be compensated with one or more adjustment processes, as detailed below with reference to FIG. 3. The adjustment component 116 can operate to compensate such error or offset with an initial coarse tuning value, resulting from the characterization and interpolation processes via the characterization component 112 or the interpolation component 114, for example. After the oscillator boot up phase (or during a powering phase or time-critical phase) of operation and setting of the initial coarse tuning value, the adjustment component 116, via the measurement component 214, operates to measure frequencies of the oscillator in order to generate comparison with a wanted or desired target frequency. Consequently, the adjustment component 116 further adjusts the coarse tuning value to further compensate for additional variations with a final corrected coarse tuning value or a final coarse tuning correctional value to the initial coarse tuning value.

Figure 3:
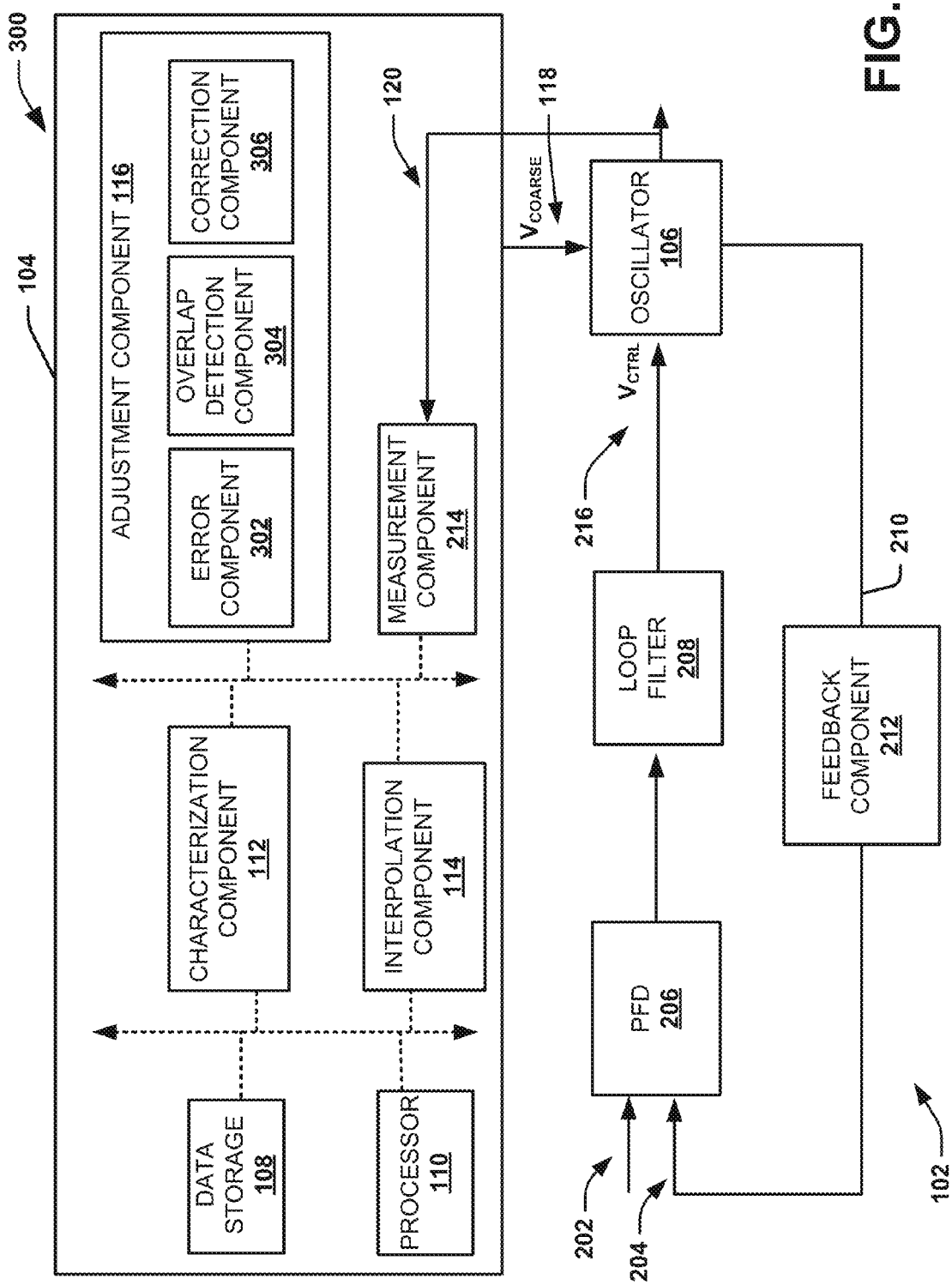
FIG. 3 illustrates another exemplary phase locked loop system in accordance with various aspects described.

Referring now to FIG. 3, illustrated is another example of a phase locked loop system that facilitates a coarse tuning selection or a coarse tuning component 104 according to various aspects. The system 300 comprises similar components as discussed above. The adjustment component 116 further includes an error component 302, an overlap detection component 304, and a correction component 306.

The error component 302 is configured to determine an error based on the initial coarse tuning value and a target value. A frequency error, for example, is determined by the error component 302. The error component 302 therefore can operate as a frequency error component that receives additional frequency measurements originated from the measurement component 214. The error component 302 can receive a desired or target frequency value, for example, from the data storage 108, an external device, or system component and compare a target frequency to a frequency based on the coarse tuning value (initial coarse tuning value) as generated from the interpolation component 114. The error component 302 can determine a difference between the frequency that is based on the initial coarse tuning value and the desired or target frequency value. In response to the difference satisfying a threshold or being detected, the error component 302 is configured to provide the difference to further components for generation of a final coarse tuning correction value or an adjusted/corrected coarse tuning value, such as at the overlap detection component 304 or the correction component 306.

The correction component 306, for example, can operate to generate a corrected coarse tuning signal, value or word based on the frequency error that is identified and determined by the error component 302. The coarse tuning correction value operates to adjust the initial coarse tuning value to generate the final coarse tuning correction value or an adjusted coarse tuning value, which can be used to set the coarse tuning of the phase locked loop before a locking state or condition. The coarse tuning correction value can comprise multiple bits, for example, that can operate to adjust or modify the initial coarse tuning value, which can also comprise multiple bits.

In one aspect, the correction component 306 can operate to generate the corrected coarse tuning value by dividing the error or the evaluated frequency difference, for example, as determined by the error component 302, with a coarse tuning step size value, which can be determined by the characterization component 112, as discussed above. Alternatively, the step-size can be determined externally and stored in data storage 108. The correction component 306 can therefore select a characteristic, such as the coarse tuning step-size from the characterization profile of the oscillator and generate the coarse tuning correction value as a function of this characteristic or another one, for example.

The overlap detection component 304 is configured to detect whether an overlap occurs between a frequency derived from the coarse tuning value and an additional frequency measurement from the measurement component 214. Overlaps, for example, can be designed into a device or system to prevent gaps or mismatches that occur in the architecture due to process variations, for example. An overlap can comprise one or more frequency values that overlap with one another along the same axis value or with approximately the same or about the same coarse tuning value. In one example, the overlaps can occur at the MSBs of the oscillator component 106, in which the position and number of the MSBs corresponding to the overlaps can be defined or dictated by the given PLL component architecture or circuit design.

The overlap detection component 304 operates to detect or analyze overlaps in the coarse tuning curve, the determined characteristics or the characterization profile before the phase locked loop is locked. These overlaps can serve to further decrease performance of the processes involved in coarse tuning and the phase locked loop system 300 overall because they typically cannot be considered or identified completely in a reasonable amount of time, such as with the operations or processes facilitated by the characterization component 112 or the interpolation component 114 alone. In response to an overlap being detected within at least a portion of the coarse tuning curve, for example, the measurement component 214 operates to determine a second additional final frequency measurement associated with the oscillator component 106. The correction component 306 operates then to further adjust the last or previous final coarse tuning value with a second coarse tuning adjustment value (second coarse tuning correction value) to form a second adjusted coarse tuning value as the final coarse tuning value. The correction component 306 further processes additional iterations accordingly until substantially all error or overlap is no longer detected or a predetermined number of iterations is achieved.

Figure 4:
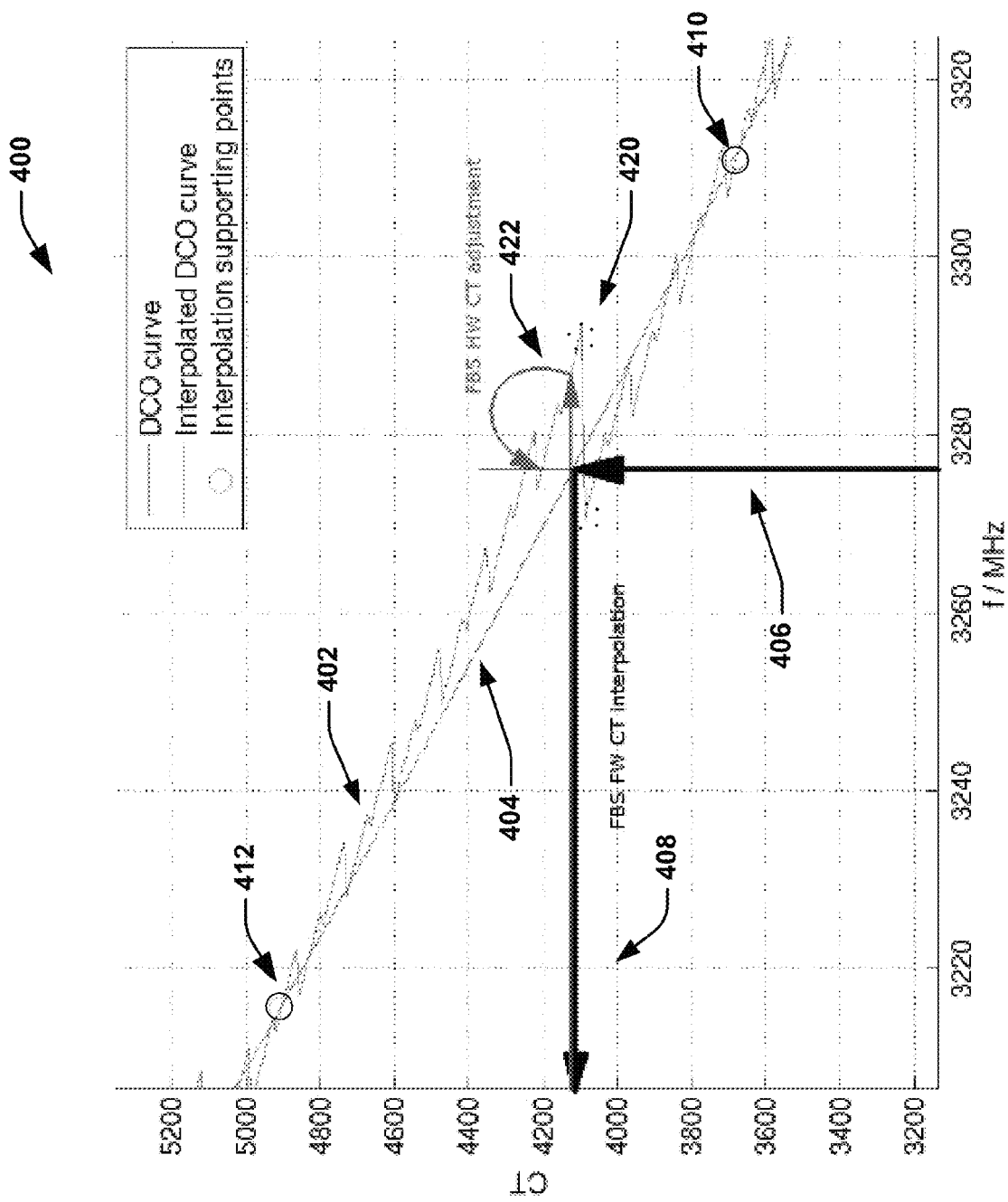
FIG. 4 illustrates a graph of a coarse tuning curve for generating a coarse tuning for an oscillator of a phase locked loop.

Referring to FIG. 4, illustrated is an example plot of coarse tuning curve with various characteristics related to the oscillator component 106, such as a digital controlled oscillator or another oscillator. The curve 402 represents a coarse tuning curve with characteristics of the oscillator. The curve 404 represents an interpolated curve based on the characteristics and determined interpolation coefficients. The curves are determined and analyzed between interpolation supporting points, such as derived from the determined characteristics, such as interpolation coefficients or the like.

When the target frequency is known, for example, the interpolation component 114 can generate an initial coarse tuning (CT) value by an interpolation between characterized frequency points. For example, the target frequency can be represented by the arrow 406 and be approximately 3275 MHz, for example. A coarse tuning value can be represented by the arrow 408 at an approximate section 410 for example, which follows from the interpolated CT curve 404 of the oscillator. The initial coarse tuning correction value can operate to adjust the coarse tuning curve 402 only to a certain extent as capable via the hardware components, which can be seen by the curved arrow 422. The overlap 420, for example, ranges from about 3275 MHz to about 3290 MHz and illustrated between the two dotted circles at the extreme points of the overlap 420. However, as a result of the detected overlap 420 condition being identified, further coarse tuning selection processes can be facilitated by the system and operations by the adjustment component 116 are triggered.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 5:
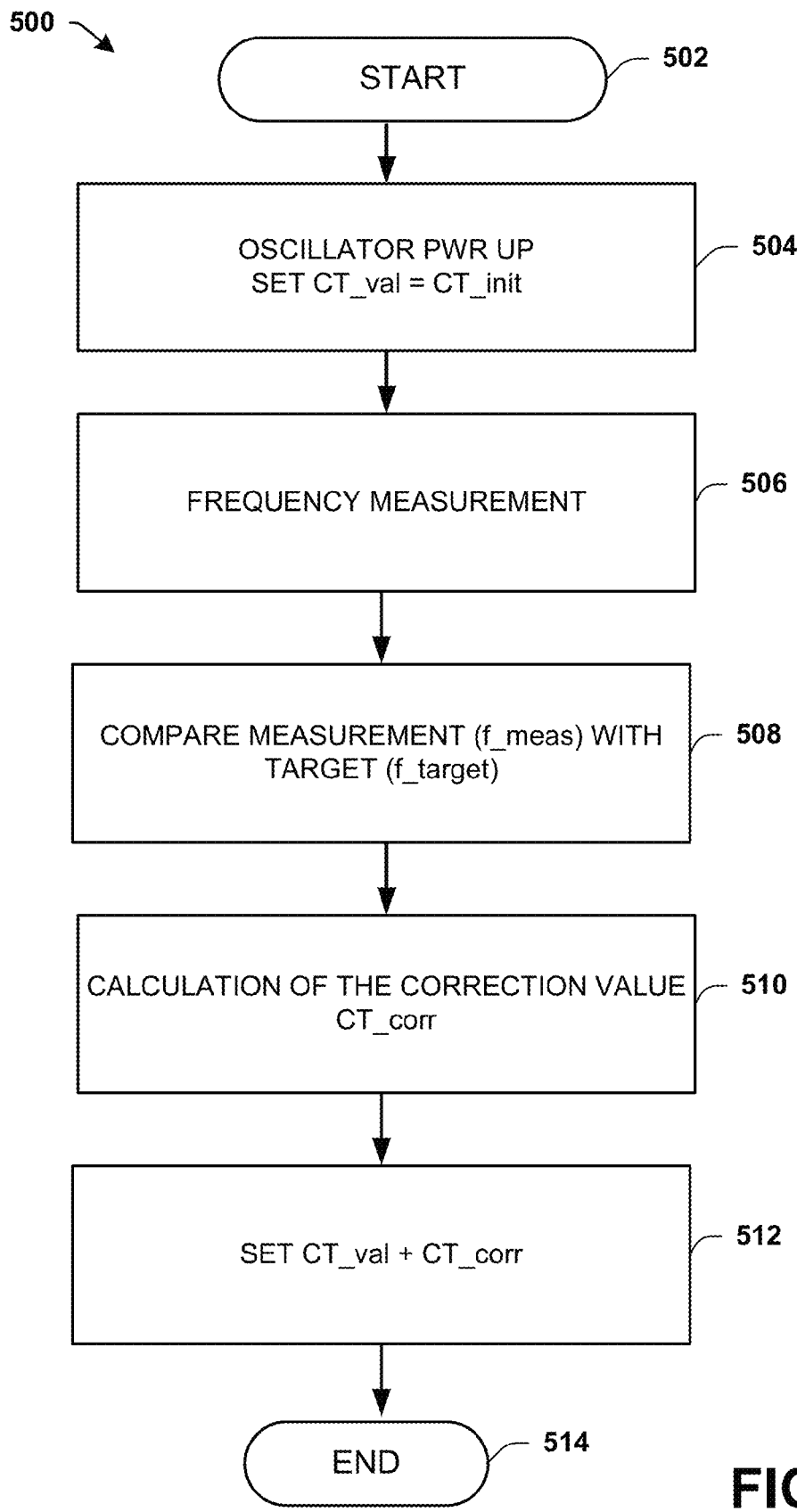
FIG. 5 illustrates a flow diagram of an exemplary method for coarse tuning selection in a phase locked loop system in accordance with various aspects described.

Referring to FIG. 5, illustrates is an example process flow for the coarse tuning of an oscillator in accord with various aspects. The method 500 initiates at 502 for selection of a coarse tuning correction value to adjust, control or set the frequency of the oscillator 106. The initial coarse tuning value is generated, for example, from the characterization and interpolation processes of the characterization component 112 and the interpolation component 114, in which the parameters or the determined characteristics are utilized for deriving the initial coarse tuning value. At 504, a coarse tuning value (CT_val) is generated as the initial coarse tuning value according to operations resulting from the characterization component 112 and the interpolation component 114. At 506, an additional frequency is then measured, such as with the measurement component 214.

After characterization and interpolation, a frequency error can be identified as remaining via the error component 302. Time differences in combination with a temperature drift between characterization and complete powering on of the phase locked loop, for example, can result in frequency offsets. The oscillator characteristics are not typically monotonic and can demonstrate a differential nonlinearity, which is not always considered by interpolation and characterization processes of the characterization component 112 or the interpolation component 114. At 506, for example, one or more additional frequency measurements can be determined. At 508, at least one of the additional frequency measurements is compared to the desired or target frequency to result in a delta frequency or a difference in frequency. At 510, from a delta frequency, a correction value is further generated, for example, by dividing an evaluated frequency difference between the additional measurements and the target frequency by a step size characteristic of the coarse tuning curve (e.g., CT_corr=(f_meas−f_target)/CT_step). A step size can be evaluated from the characteristic profile or operations of the characterization component 112, for example. The coarse tuning step size can represent a difference from one value to another, such as coarse tuning values along an axis of the plot. At 512, the correction value (e.g., CT_corr) is then applied to the initial coarse tuning value to obtain a final coarse tuning value for coarse tuning the oscillator component 106.

Figure 6:
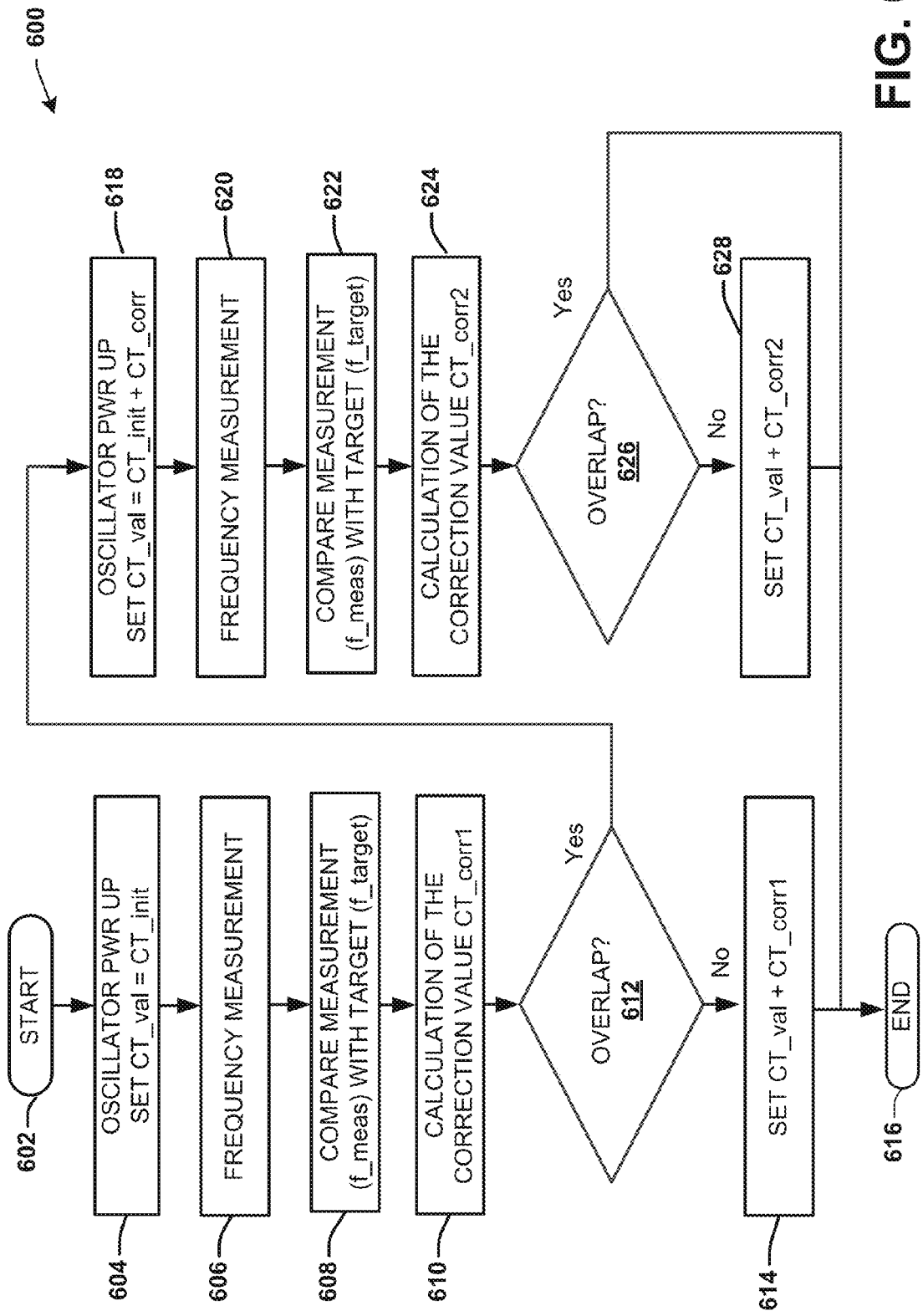
FIG. 6 illustrates a flow diagram of an exemplary method for coarse tuning selection in a phase locked loop system in accordance with various aspects described.

Referring to FIG. 6, illustrated is another example process flow for the coarse tuning of an oscillator in accord with various aspects. The method 600 comprises similar aspects as the method 500 discussed above. At 602, the method initializes, and at 604 a coarse tuning value (CT_val) is generated as an initial coarse tuning value (CT_init). At 606, an initial frequency is measured and compared to a target frequency at 608. At 610, the correction value is generated from a delta frequency calculated between the additional measured frequency and the target frequency.

At 612, an overlap is identified from one or more coarse tuning curves or the behavioral characteristics of the oscillator component 106. The characteristics or the oscillator profile can be analyzed to detect overlaps and further enhance the coarse tuning operations implemented. An oscillator profile, as discussed above, can include the characteristics, a coarse tuning curve, interpolation coefficients, defined supporting points or nodes, step sizes in the adjustment levels or different coarse tuning values with respect to frequency points along a curve, gain values from one the values in coarse tuning, other characteristics related to the oscillator component 106 such as values, ranges, number of overlaps, overlap ranges, position of overlaps in the data bits or MSBs, MSBs related to overlapping conditions or points of a curve, or other related characteristics.

In one example, the overlap can be determined based on whether a predetermined threshold has been satisfied according to the following condition: MSBs(CT_val+CT_corr)≠MSBs(CT_val). In one aspect, where there is an offset satisfying a threshold frequency that deviates from the target frequency, then a resulting correctional value to the initial coarse tuning value is still significant enough that an overlap is identified. As such, after the most significant bits related to a correctional value applied to the coarse tuning value still results in a significant offset, an offset can be determined, the values stored and the method enter into an additional iteration at 618. Alternatively, if the condition that the corrected coarse tuning value (MSBs(CT_val+CT_corr)) is approximately equal to the MSBs(CT_val) then a significant correction has been made or no longer feasible along this overlap portion of the oscillator characteristics, such as along the analyzed coarse tuning curve and the interpolation curves. Accordingly, the method 600 flows to 614 where the oscillator is set with the resulting coarse tuning value or a final coarse tuning value before locking of the phase locked loop. Other regions, portions or characteristics of the coarse tuning could be adjusted or operated on as above depending upon the number of detected overlaps in the oscillator operation.

In some instances, after an overlap has been identified and an additional measurement has been determined, the method 600 flows to setting the initial coarse tuning value as the coarse tuning value previously corrected by the corrected value. At 620, an additional frequency measurement is made, and at 622 a comparison of the additional frequency measurement with the target frequency is determined. At 624, a second correctional value is determined resulting in a further correction value CT_corr2 based on the difference between the target frequency and the additional measured frequency from 620. A determination is made as to whether the overlap still exists at 626, or, in other words, whether an overlap is detected between the actual coarse tuning value and the actual coarse tuning value plus the additional or further correction value (CT_val versus CT_val+CT_corr2). If the answer is yes, then the coarse tuning correction value (CT_corr2) is not applied and the process flows to completion at 616. If the answer to the determination is no, then the process flows at 628 to set the coarse tuning value with the second correctional value (CT_corr2). The process continues with a number of iterations until an overlap is not detected or until a predetermined number of iterations is met as a threshold level. The process flow then ends at 616. In one aspect, the iterations or process flows can be one or more iterations, for example until overlaps are compensated in the adjustment processes to not exceed a determined threshold or acceptable level or are no longer detected.

Figure 7:
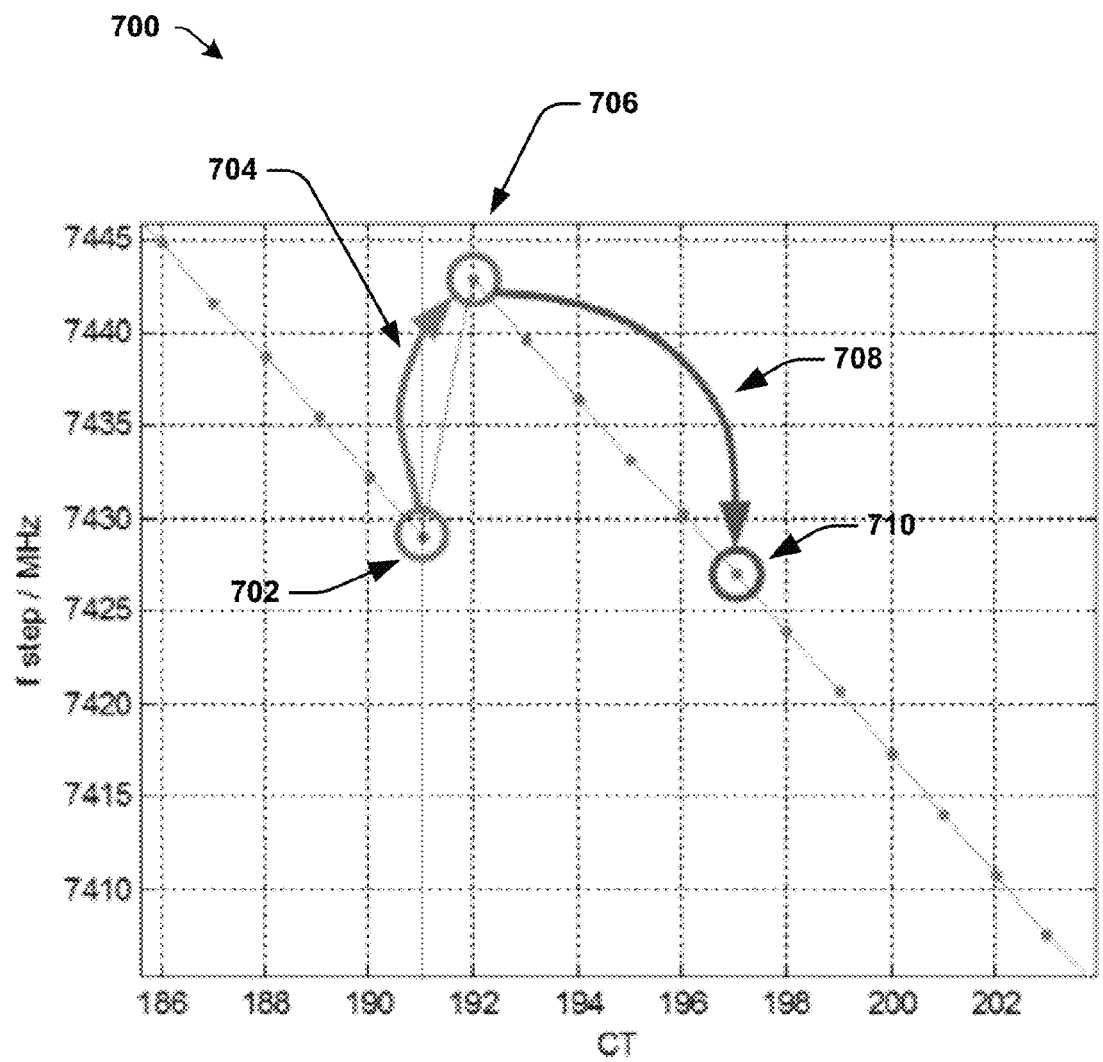
FIG. 7 illustrates another graph of a coarse tuning curve for generating a coarse tuning for an oscillator of a phase locked loop.

Referring to FIG. 7, illustrated is an example graph of an overlap condition in a coarse tuning value in accordance with various aspects. A portion of a coarse tuning curve 700 that operates to adjust or set the coarse tuning value of the oscillator is illustrated with a vertical axis represented by frequencies in frequency steps or step sizes (f step/MHz) and a horizontal axis represented by a set of coarse tuning values in different coarse tuning steps or CT_step sizes. At 702 an initial coarse tuning value is determined according to characteristics and interpolation processes of the characteristics related to the oscillator. For example, the initial coarse tuning value can be about 191. In this particular example, the target frequency can be 7426 MHz. The adjustment processes by the adjustment component 116 are triggered, in which a first measurement is determined as indicated by the arrow 704, and a correction via a correctional value is generated that increments the coarse tuning value to a CT of about 192. However, this results in a higher level of frequency and thus an overlap region is detected, which then triggers a second iteration or a second measurement process as indicated by the arrow 708. An additional correctional value is generated. A decision is made as to whether the overlap is then detected; if not, then the coarse tuning value has been determined, but if so, then a repeat measurement and adjustment to the coarse tuning value is further generated. Because the overlaps are implemented in the MSB cross overs between the interpolated coarse tuning curve and the characterized coarse tuning curve, for example, the detection can be implemented by masking operations in conjunction with a XOR operation or gate, for example, such as ((CT_val+CT_corr) & MASK) XOR (CT_val & MASK).

Figure 8:
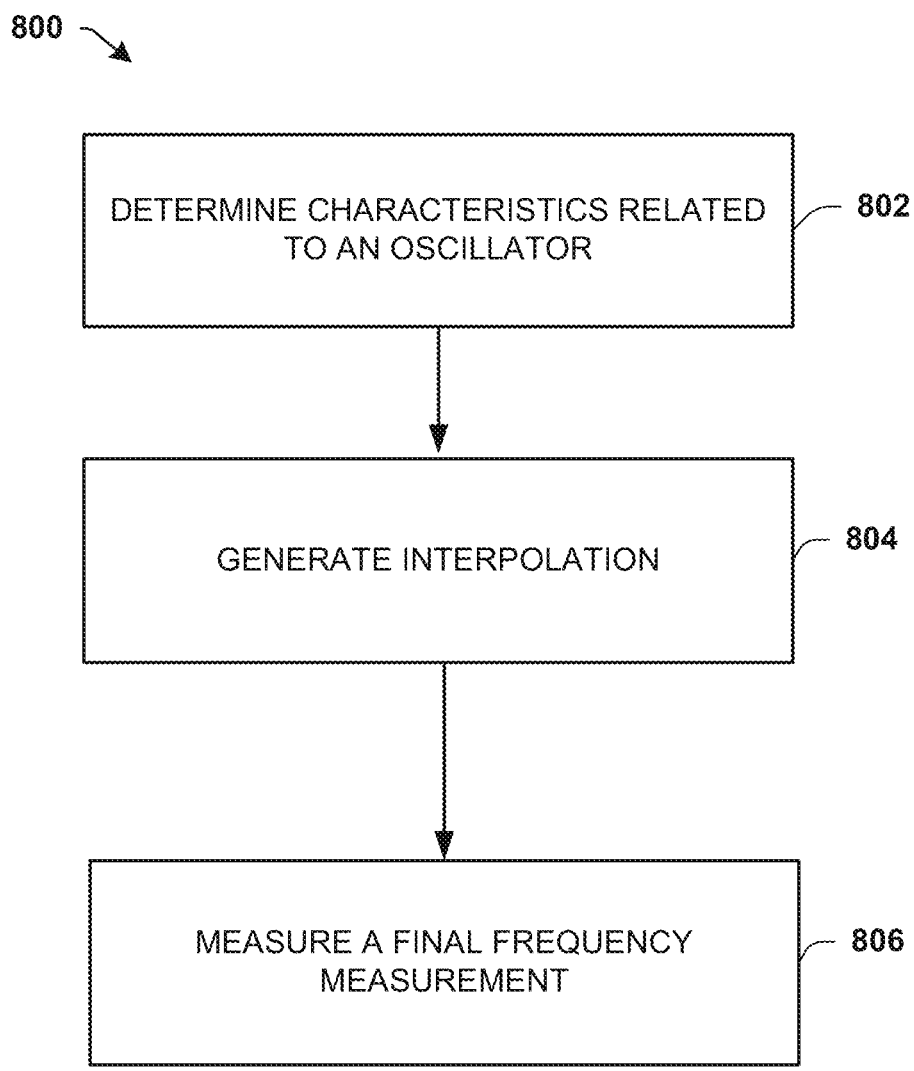
FIG. 8 illustrates a flow diagram of a method for a phase locked loop system in accordance with various aspects described.

Referring to FIG. 8, illustrated is another method for coarse tuning selection for a phase locked loop system in accord with various aspects. At 802, determining, by a phase locked loop device including at least one processor, a plurality of characteristics related to an oscillator of the phase locked loop device.

At 804, the method includes generating an interpolation (e.g., an interpolation curve), via the interpolation component 114, based on one or more of the characteristics to determine a coarse tuning value that sets a coarse tuning of the oscillator. Generating the interpolation, for example, can comprise determining the coarse tuning value based on initial frequency measurements. In addition, the interpolation can be based on coefficients determined by an approximation of a coarse tuning curve with respect to a frequency of the oscillator for a set of coarse tuning values.

At 806, the method includes determining at least one final frequency measurement to generate a final coarse tuning value and setting the coarse tuning of the phase locked loop device.

In other embodiments, the method can comprise adjusting the coarse tuning value based on a first final frequency measurement of the at least one final frequency measurement to generate the final coarse tuning value. Alternatively or additionally, the method can comprise determining a remaining frequency error based on a first final frequency measurement of the at least one final frequency measurement and a target frequency value, generating a correction value based on the remaining frequency error, and generating a corrected coarse tuning value by adjusting the coarse tuning value as a function of the coarse tuning correction value.

The method 800 can further comprise detecting, within a predetermined number of iterations, whether an overlap occurs between the initial coarse tuning value and the corrected coarse tuning value. In response to the overlap being detected, within the predetermined number of iterations determining at least one second final frequency measurement, determining at least one second remaining frequency error based on the at least one second final frequency measurement and the target frequency value, generating at least one second correction value based on the at least one second remaining frequency error, and generating at least one second corrected coarse tuning value by adjusting the corrected coarse tuning value or a previous corrected coarse tuning value as a function of the at least one second correction value.

Figure 9:
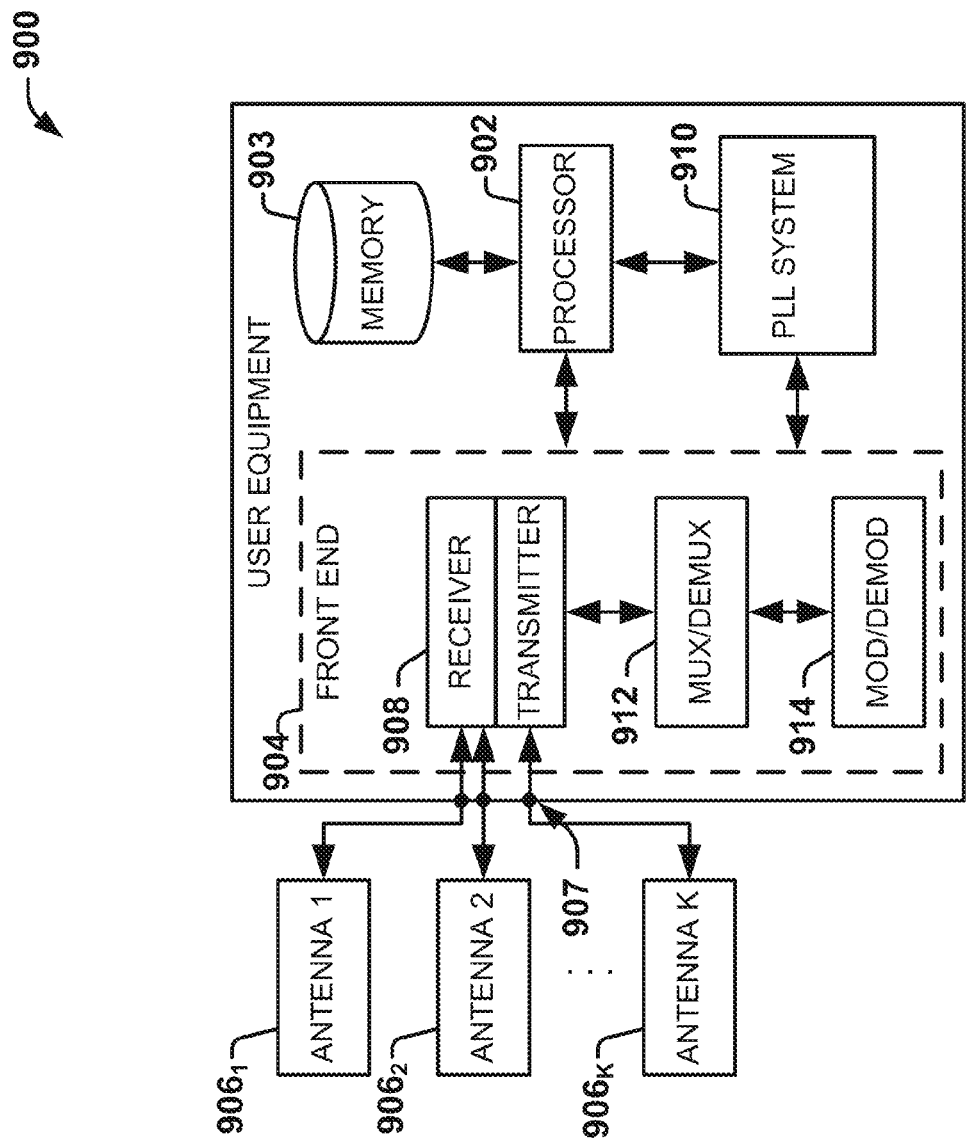
FIG. 9 illustrates an exemplary mobile communication device having a phase locked loop system in accordance with various aspects described.

To provide further context for various aspects of the disclosed subject matter, FIG. 9 illustrates a block diagram of an embodiment of access equipment, user equipment (e.g., a mobile device, communication device, personal digital assistant, etc.) or software 900 related to access of a network (e.g., base station, wireless access point, femtocell access point, and so forth) that can enable and/or exploit features or aspects of the disclosed aspects.

The user equipment or mobile communication device 900 can be utilized with one or more aspects of the PLLs or PA devices described according to various aspects. The mobile communication device 900, for example, comprises a digital baseband processor 902 that can be coupled to a data store or memory 903, a front end 904 (e.g., an RF front end, an acoustic front end, or the other like front end) and a plurality of antenna ports 907 for connecting to a plurality of antennas 906₁ to 906ₖ (k being a positive integer). The antennas 906₁ to 906ₖ can receive and transmit signals to and from one or more wireless devices such as access points, access terminals, wireless ports, routers and so forth, which can operate within a radio access network or other communication network generated via a network device (not shown). The user equipment 900 can be a radio frequency (RF) device for communicating RF signals, an acoustic device for communicating acoustic signals, or any other signal communication device, such as a computer, a personal digital assistant, a mobile phone or smart phone, a tablet PC, a modem, a notebook, a router, a switch, a repeater, a PC, network device, base station or a like device that can operate to communicate with a network or other device according to one or more different communication protocols or standards.

The front end 904 can include a communication platform, which comprises electronic components and associated circuitry that provide for processing, manipulation or shaping of the received or transmitted signals via one or more receivers or transmitters 908, a mux/demux component 912, and a mod/demod component 914. The front end 904, for example, is coupled to the digital baseband processor 902 and the set of antenna ports 907, in which the set of antennas 906₁ to 906ₖ can be part of the front end. In one aspect, the mobile communication device 900 can comprise a phase locked loop system 910 that operates with a coarse tuning and a fine tuning operation to an oscillator according to aspects disclosed herein.

The user equipment device 900 can also include a processor 902 or a controller that can operate to provide or control one or more components of the mobile device 900. For example, the processor 902 can confer functionality, at least in part, to substantially any electronic component within the mobile communication device 900, in accordance with aspects of the disclosure. As an example, the processor can be configured to execute, at least in part, executable instructions that control various modes of the phase locked loop system 910 as a multi-mode operation chipset that affords different power generation operations for input signals at the antenna ports 907, an input terminal or other terminal based on one or more characteristics of the oscillator of the phase locked loop.

The processor 902 can operate to enable the mobile communication device 900 to process data (e.g., symbols, bits, or chips) for multiplexing/demultiplexing with the mux/demux component 912, or modulation/demodulation via the mod/demod component 914, such as implementing direct and inverse fast Fourier transforms, selection of modulation rates, selection of data packet formats, inter-packet times, etc. Memory 903 can store data structures (e.g., metadata), code structure(s) (e.g., modules, objects, classes, procedures, or the like) or instructions, network or device information such as policies and specifications, attachment protocols, code sequences for scrambling, spreading and pilot (e.g., reference signal(s)) transmission, frequency offsets, cell IDs, and other data for detecting and identifying various characteristics related to RF input signals, a power output or other signal components during power generation.

The processor 902 is functionally and/or communicatively coupled (e.g., through a memory bus) to memory 903 in order to store or retrieve information necessary to operate and confer functionality, at least in part, to communication platform or front end 904, the phase locked loop system 910 and substantially any other operational aspects of the phase locked loop system 910. The phase locked loop system 910 includes at least one oscillator (e.g., a VCO, DCO or the like) that can be calibrated via a coarse tuning value, signal, word or selection process according the various aspects described herein.

Examples herein can include subject matter such as a method, means for performing acts or blocks of the method, at least one machine-readable medium including executable instructions that, when performed by a machine (e.g., a processor with memory or the like) cause the machine to perform acts of the method or of an apparatus or system for concurrent communication using multiple communication technologies according to embodiments and examples described.

Example 1 is a phase locked loop system comprising a characterization component configured to determine a plurality of characteristics related to an oscillator of a phase locked loop component. An interpolation component is configured to generate an interpolation of the plurality of characteristics to determine a coarse tuning value that is configured to generate a coarse tuning of the oscillator. An adjustment component configured to adjust the coarse tuning value based on at least one final frequency measurement to generate a final coarse tuning value and set the coarse tuning of the oscillator based on the final coarse tuning value.

Example 2 includes the subject matter of Example 1, wherein the characterization component is further configured to determine the plurality of characteristics during a non-time critical phase of the phase locked loop component.

Example 3 includes the subject matter of any of Examples 1 and 2, including or omitting optional elements, wherein the non-time critical phase comprises a boot phase of the phase locked loop component before a locking phase of the phase locked loop component.

Example 4 includes the subject matter of any of Examples 1-3, including or omitting optional elements, wherein the adjustment component is further configured to adjust the coarse tuning value with a coarse tuning correction value based on the at least one final frequency measurement.

Example 5 includes the subject matter of any of Examples 1-4, including or omitting optional elements, wherein the characterization component is further configured to determine the plurality of characteristics related to the oscillator by determining a plurality of frequency measurements.

Example 6 includes the subject matter of any of Examples 1-5, including or omitting optional elements, wherein the interpolation component is further configured to generate the interpolation based on a target frequency and of the plurality of characteristics to determine the coarse tuning value.

Example 7 includes the subject matter of any of Examples 1-6, including or omitting optional elements, wherein the oscillator comprises a digital controlled oscillator, or a voltage controlled oscillator, that is configured to be coarse tuned by a coarse tuning word or signal in an open loop state and locked in a closed loop state by a fine tuning word or signal to synchronize a reference signal and a feedback signal.

Example 8 includes the subject matter of any of Examples 1-7, including or omitting optional elements, wherein the adjustment component comprises an error component configured to determine a frequency error between a frequency value based on the coarse tuning value and a target frequency, and a correction component configured to calculate a corrected coarse tuning value based on the frequency error.

Example 9 includes the subject matter of any of Examples 1-8, including or omitting optional elements, further comprising a measurement component configured to determine the at least one final frequency measurement of the oscillator after a boot-up or powering phase of the phase locked loop component.

Example 10 includes the subject matter of any of Examples 1-9, including or omitting optional elements, wherein the adjustment component further comprises an overlap detection component configured to detect whether an overlap occurs between the coarse tuning value and an additional coarse tuning value based on a first final frequency measurement of the at least one final frequency measurement. The adjustment component is further configured to determine a second final frequency measurement in response to the overlap occurring, and the adjustment component is further configured to further adjust the coarse tuning value with the second final frequency measurement to generate the final coarse tuning value.

Example 11 is a method for coarse tuning an oscillator comprising determining, by a phase locked loop device including at least one processor, a plurality of characteristics related to an oscillator of the phase locked loop device; generating an interpolation based on the plurality of characteristics to determine a coarse tuning value that sets a coarse tuning of the phase locked loop device with the oscillator; and measuring at least one final frequency measurement to generate a final coarse tuning value and setting the coarse tuning of the phase locked loop device.

Example 12 includes the subject matter of Example 11 wherein the determining the plurality of characteristics comprises determining at least one of a plurality of initial frequency measurements of the oscillator, an approximation of a coarse tuning curve with respect to a frequency of the oscillator and a set of coarse time points, a coarse tuning step size, or a plurality of interpolation coefficients based on the coarse tuning curve, during a non-time critical phase of operation of the oscillator in an open loop configuration.

Example 13 includes the subject matter of any of Examples 11 or 12, including or omitting option elements, wherein the generating the interpolation comprises determining the coarse tuning value based on a plurality of initial frequency measurements as the plurality of characteristics during a time critical phase of operation that comprises a phase locked loop locking phase.

Example 14 includes the subject matter of any of Examples 11-13, including or omitting option elements, wherein the generating the interpolation comprises generating the interpolation based on a plurality of coefficients determined by an approximation of a coarse tuning curve with respect to a frequency of the oscillator for a set of coarse time points.

Example 15 includes the subject matter of any of Examples 11-14, including or omitting option elements, further comprising adjusting the coarse tuning value based on a first final frequency measurement of the at least one final frequency measurement to generate the final coarse tuning value.

Example 16 includes the subject matter of any of Examples 11-15, including or omitting option elements, further comprising determining a remaining frequency error based on a first final frequency measurement of the at least one final frequency measurement and a target frequency value; generating a correction value based on the remaining frequency error; and generating a corrected coarse tuning value by adjusting the coarse tuning value as a function of the correction value.

Example 17 includes the subject matter of any of Examples 11-16, including or omitting option elements, wherein the generating the correction value comprises generating the correction value as a function of a coarse tuning step size.

Example 18 includes the subject matter of any of Examples 11-17, including or omitting option elements, further comprising detecting, within a predetermined number of iterations, whether an overlap occurs with the corrected coarse tuning value and the coarse tuning value; in response to the overlap being detected, within the predetermined number of iterations: determining at least one second final frequency measurement; determining at least one second remaining frequency error based on the at least one second final frequency measurement and the target frequency value; generating at least one second correction value based on the at least one second remaining frequency error; and generating at least one second corrected coarse tuning value by adjusting the corrected coarse tuning value or a previous corrected coarse tuning value as a function of the at least one second correction value.

Example 19 is a mobile device comprising a phase locked loop device comprising: an oscillator; a memory storing executable instructions; and at least one processor, communicatively coupled to the memory, configured to execute the executable instructions to at least: determine a plurality of characteristics comprising at least one frequency measurement related to the oscillator of the phase locked loop device; generate a coarse tuning value by generating an interpolation of the at least one frequency measurement and a target frequency of the oscillator; and measure at least one final frequency measurement of the phase locked loop device to adjust the coarse tuning value to generate an adjusted coarse tuning value and set a coarse tuning of the phase locked loop device with the adjusted coarse tuning value.

Example 20 includes the subject matter of claim 19 wherein the at least one processor is further configured to execute the executable instructions to: determine a remaining frequency error based on the adjusted coarse tuning value and the target frequency; generate a correction value based on the remaining frequency error; and generate a final coarse tuning value by adjusting the adjusted coarse tuning value as a function of the correction value.

Example 21 includes the subject matter of any of Examples 19-20, including or omitting option elements, wherein the oscillator comprises a voltage controlled oscillator, or a digital control oscillator, configured to be set by the coarse tuning and a fine tuning to generate at least one frequency in locked phase of operation with different biasing values.

Example 22 includes the subject matter of any of Examples 19-21, including or omitting option elements, wherein the plurality of characteristics comprises determining at least one of a plurality of initial frequency measurements of the oscillator, an approximation of a coarse tuning curve with respect to a frequency of the oscillator for a set of coarse time points, a coarse tuning step size, or a plurality of interpolation coefficients based on the coarse tuning curve.

Example 23 includes the subject matter of any of Examples 19-22, including or omitting option elements, wherein the at least one processor is further configured to execute the executable instructions to: detect an overlap at most significant bit crossovers in an approximation of a coarse tuning curve with respect to a plurality of frequencies of the oscillator for coarse time points, between the coarse tuning value and a first measurement of the at least one final frequency measurement.

Example 24 includes the subject matter of any of Examples 19-23, including or omitting option elements, wherein the at least one processor is further configured to execute the executable instructions to: adjust the coarse tuning value based on a first final frequency measurement of the at least one final frequency measurement to generate the adjusted coarse tuning value as a final coarse tuning value that defines the coarse tuning of the phase locked loop device.

Example 25 includes the subject matter of any of Examples 19-25, including or omitting option elements, wherein the at least one processor is further configured to execute the executable instructions to: determine the plurality of characteristics comprising at least two frequency measurements related to the oscillator during a boot-up phase of the phase locked loop device.

Applications (e.g., program modules) can include routines, programs, components, data structures, etc., that perform particular tasks or implement particular abstract data types. Moreover, those skilled in the art will appreciate that the operations disclosed can be practiced with other system configurations, including single-processor or multiprocessor systems, minicomputers, mainframe computers, as well as personal computers, hand-held computing devices, microprocessor-based or programmable consumer electronics, and the like, each of which can be operatively coupled to one or more associated mobile or personal computing devices.

A computing device can typically include a variety of computer-readable media. Computer readable media can be any available media that can be accessed by the computer and includes both volatile and non-volatile media, removable and non-removable media. By way of example and not limitation, computer-readable media can comprise computer storage media and communication media. Computer storage media includes both volatile and non-volatile, removable and non-removable media implemented in any method or technology for storage of information such as computer-readable instructions, data structures, program modules or other data. Computer storage media (e.g., one or more data stores) can include, but is not limited to, RAM, ROM, EEPROM, flash memory or other memory technology, CD ROM, digital versatile disk (DVD) or other optical disk storage, magnetic cassettes, magnetic tape, magnetic disk storage or other magnetic storage devices, or any other medium which can be used to store the desired information and which can be accessed by the computer.

Communication media typically embodies computer-readable instructions, data structures, program modules or other data in a modulated data signal such as a carrier wave or other transport mechanism, and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

It is to be understood that aspects described herein may be implemented by hardware, software, firmware, or any combination thereof. When implemented in software, functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Various illustrative logics, logical blocks, modules, and circuits described in connection with aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor may be a microprocessor, but, in the alternative, processor may be any conventional processor, controller, microcontroller, or state machine. A processor may also be implemented as a combination of computing devices, for example, a combination of a DSP and a microprocessor, a plurality of microprocessors, one or more microprocessors in conjunction with a DSP core, or any other such configuration. Additionally, at least one processor may comprise one or more modules operable to perform one or more of the acts and/or actions described herein.

For a software implementation, techniques described herein may be implemented with modules (e.g., procedures, functions, and so on) that perform functions described herein. Software codes may be stored in memory units and executed by processors. Memory unit may be implemented within processor or external to processor, in which case memory unit can be communicatively coupled to processor through various means as is known in the art. Further, at least one processor may include one or more modules operable to perform functions described herein.

Techniques described herein may be used for various wireless communication systems such as CDMA, TDMA, FDMA, OFDMA, SC-FDMA and other systems. The terms "system" and "network" are often used interchangeably. A CDMA system may implement a radio technology such as Universal Terrestrial Radio Access (UTRA), CDMA2000, etc. UTRA includes Wideband-CDMA (W-CDMA) and other variants of CDMA. Further, CDMA2000 covers IS-2000, IS-95 and IS-856 standards. A TDMA system may implement a radio technology such as Global System for Mobile Communications (GSM). An OFDMA system may implement a radio technology such as Evolved UTRA (E-UTRA), Ultra Mobile Broadband (UMB), IEEE 802.11 (Wi-Fi), IEEE 802.16 (WiMAX), IEEE 802.20, Flash-OFDM, etc. UTRA and E-UTRA are part of Universal Mobile Telecommunication System (UMTS). 3GPP Long Term Evolution (LTE) is a release of UMTS that uses E-UTRA, which employs OFDMA on downlink and SC-FDMA on uplink. UTRA, E-UTRA, UMTS, LTE and GSM are described in documents from an organization named "3rd Generation Partnership Project" (3GPP). Additionally, CDMA2000 and UMB are described in documents from an organization named "3rd Generation Partnership Project 2" (3GPP2). Further, such wireless communication systems may additionally include peer-to-peer (e.g., mobile-to-mobile) ad hoc network systems often using unpaired unlicensed spectrums, 802.xx wireless LAN, BLUETOOTH and any other short- or long-range, wireless communication techniques.

Single carrier frequency division multiple access (SC-FDMA), which utilizes single carrier modulation and frequency domain equalization is a technique that can be utilized with the disclosed aspects. SC-FDMA has similar performance and essentially a similar overall complexity as those of OFDMA system. SC-FDMA signal has lower peak-to-average power ratio (PAPR) because of its inherent single carrier structure. SC-FDMA can be utilized in uplink communications where lower PAPR can benefit a mobile terminal in terms of transmit power efficiency.

Moreover, various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer-readable media can include but are not limited to magnetic storage devices (e.g., hard disk, floppy disk, magnetic strips, etc.), optical discs (e.g., compact disc (CD), digital versatile disc (DVD), etc.), smart cards, and flash memory devices (e.g., EPROM, card, stick, key drive, etc.). Additionally, various storage media described herein can represent one or more devices and/or other machine-readable media for storing information. The term "machine-readable medium" can include, without being limited to, wireless channels and various other media capable of storing, containing, and/or carrying instruction(s) and/or data. Additionally, a computer program product may include a computer readable medium having one or more instructions or codes operable to cause a computer to perform functions described herein.

Further, the acts and/or actions of a method or algorithm described in connection with aspects disclosed herein may be embodied directly in hardware, in a software module executed by a processor, or a combination thereof. A software module may reside in RAM memory, flash memory, ROM memory, EPROM memory, EEPROM memory, registers, a hard disk, a removable disk, a CD-ROM, or any other form of storage medium known in the art. An exemplary storage medium may be coupled to processor, such that processor can read information from, and write information to, storage medium. In the alternative, storage medium may be integral to processor. Further, in some aspects, processor and storage medium may reside in an ASIC. Additionally, ASIC may reside in a user terminal. In the alternative, processor and storage medium may reside as discrete components in a user terminal. Additionally, in some aspects, the acts and/or actions of a method or algorithm may reside as one or any combination or set of codes and/or instructions on a machine-readable medium and/or computer readable medium, which may be incorporated into a computer program product.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature may have been disclosed with respect to only one of several implementations, such feature may be combined with one or more other features of the other implementations as may be desired and advantageous for any given or particular application.

What is claimed is:

1. A phase locked loop system comprising:
   a characterization component configured to determine a plurality of characteristics related to an oscillator of a phase locked loop component;
   an interpolation component configured to generate an interpolation of the plurality of characteristics to determine a coarse tuning value that is configured to generate a coarse tuning of the oscillator;
   an adjustment component configured to adjust the coarse tuning value based on at least one final frequency measurement to generate a final coarse tuning value that sets the coarse tuning of the oscillator; and
   an overlap detection component configured to detect whether an overlap occurs between the coarse tuning value and an additional coarse tuning value based on the at least one final frequency measurement;
   wherein the adjustment component, in response to the overlap occurring, is further configured to generate the final course tuning value based on the overlap.

2. The phase locked loop system of claim 1, wherein the characterization component is further configured to determine the plurality of characteristics during a non-time critical phase of the phase locked loop component.

3. The phase locked loop system of claim 2, wherein the non-time critical phase comprises a boot phase of the phase locked loop component before a locking phase of the phase locked loop component.

4. The phase locked loop system of claim 1, wherein the adjustment component is further configured to adjust the coarse tuning value with a coarse tuning correction value based on the at least one final frequency measurement.

5. The phase locked loop system of claim 1, wherein the characterization component is further configured to determine the plurality of characteristics related to the oscillator by determining a plurality of frequency measurements.

6. The phase locked loop system of claim 1, wherein the interpolation component is further configured to generate the interpolation based on a target frequency and of the plurality of characteristics to determine the coarse tuning value.

7. The phase locked loop system of claim 1, wherein the oscillator comprises a digital controlled oscillator, or a voltage controlled oscillator, that is configured to be coarse tuned by a coarse tuning word or signal in an open loop state and locked in a closed loop state by a fine tuning word or signal to synchronize a reference signal and a feedback signal.

8. The phase locked loop system of claim 1, wherein the adjustment component comprises:
   an error component configured to determine a frequency error between a frequency value based on the coarse tuning value and a target frequency; and
   a correction component configured to calculate a corrected coarse tuning value based on the frequency error.

9. The phase locked loop system of claim 1, further comprising:
   a measurement component configured to determine the at least one final frequency measurement of the oscillator after a boot-up or powering phase of the phase locked loop component.

10. The phase locked loop system of claim 9, wherein the measurement component is further configured to determine a second final frequency measurement in response to the overlap occurring, and the adjustment component is further configured to further adjust the coarse tuning value with the second final frequency measurement to generate the final coarse tuning value.

11. A method for coarse tuning an oscillator, comprising:
    determining, by a phase locked loop device including at least one processor, a plurality of characteristics related to the oscillator of the phase locked loop device;
    generating an interpolation based on the plurality of characteristics to determine a coarse tuning value that sets a coarse tuning of the phase locked loop device with the oscillator;
    measuring at least one final frequency measurement;
    detecting whether an overlap occurs between the coarse tuning value and an additional coarse tuning value based on the at least one final frequency measurement;
    in response to the overlap occurring, generating a final course tuning value based on the overlap; and
    setting the coarse tuning of the phase locked loop device.

12. The method of claim 11, wherein the determining the plurality of characteristics comprises determining at least one of a plurality of initial frequency measurements of the oscillator, an approximation of a coarse tuning curve with respect to a frequency of the oscillator and a set of coarse time points, a coarse tuning step size, or a plurality of interpolation coefficients based on the coarse tuning curve, during a non-time critical phase of operation of the oscillator in an open loop configuration.

13. The method of claim 11, wherein the generating the interpolation comprises determining the coarse tuning value based on a plurality of initial frequency measurements as the plurality of characteristics during a time critical phase of operation that comprises a phase locked loop locking phase.

14. The method of claim 11, wherein the generating the interpolation comprises generating the interpolation based on a plurality of coefficients determined by an approximation of a coarse tuning curve with respect to a frequency of the oscillator for a set of coarse time points.

15. The method of claim 11, further comprising:
    adjusting the coarse tuning value based on a first final frequency measurement of the at least one final frequency measurement to generate the final coarse tuning value.

16. The method of claim 11, further comprising:
    determining a remaining frequency error based on a first final frequency measurement of the at least one final frequency measurement and a target frequency value;
    generating a correction value based on the remaining frequency error; and generating a corrected coarse tuning value by adjusting the coarse tuning value as a function of the correction value.

17. The method of claim 16, wherein the generating the correction value comprises generating the correction value as a function of a coarse tuning step size.

18. The method of claim 16, further comprising:
in response to the overlap being detected, within a predetermined number of iterations:
determining at least one second final frequency measurement;
determining at least one second remaining frequency error based on the at least one second final frequency measurement and the target frequency value;
generating at least one second correction value based on the at least one second remaining frequency error; and
generating at least one second corrected coarse tuning value by adjusting the corrected coarse tuning value or a previous corrected coarse tuning value as a function of the at least one second correction value.

19. A mobile device comprising:
a phase locked loop device comprising:
an oscillator;
a memory storing executable instructions;
at least one processor, communicatively coupled to the memory, configured to execute the executable instructions to at least:
determine a plurality of characteristics comprising at least one frequency measurement related to the oscillator of the phase locked loop device;
generate a coarse tuning value by generating an interpolation of the at least one frequency measurement and a target frequency of the oscillator; and
measure at least one final frequency measurement of the phase locked loop device;
adjust the coarse tuning value to generate an adjusted coarse tuning value and set a coarse tuning of the phase locked loop device with the adjusted coarse tuning value;
detect whether an overlap occurs between the coarse tuning value and an additional coarse tuning value based on the at least one final frequency measurement; and
in response to the overlap occurring, generate a final course tuning value based on the overlap.

20. The mobile device of claim 19, wherein the at least one processor is further configured to execute the executable instructions to:
determine a remaining frequency error based on the adjusted coarse tuning value and the target frequency;
generate a correction value based on the remaining frequency error; and
generate the final coarse tuning value by adjusting the adjusted coarse tuning value as a function of the correction value.

21. The mobile device of claim 19, wherein the oscillator comprises a voltage controlled oscillator, or a digital control oscillator, configured to be set by the coarse tuning and a fine tuning to generate at least one frequency in locked phase of operation with different biasing values.

22. The mobile device of claim 19, wherein the plurality of characteristics comprises determining at least one of a plurality of initial frequency measurements of the oscillator, an approximation of a coarse tuning curve with respect to a frequency of the oscillator for a set of coarse time points, a coarse tuning step size, or a plurality of interpolation coefficients based on the coarse tuning curve.

23. The mobile device of claim 19, wherein the at least one processor is further configured to execute the executable instructions to:
detect the overlap at most significant bit crossovers in an approximation of a coarse tuning curve with respect to a plurality of frequencies of the oscillator for coarse time points, between the coarse tuning value and a first measurement of the at least one final frequency measurement.

24. The mobile device of claim 19, wherein the at least one processor is further configured to execute the executable instructions to:
adjust the coarse tuning value based on a first final frequency measurement of the at least one final frequency measurement to generate the adjusted coarse tuning value as a final coarse tuning value that defines the coarse tuning of the phase locked loop device.

25. The mobile device of claim 19, wherein the at least one processor is further configured to execute the executable instructions to:
determine the plurality of characteristics comprising at least two frequency measurements related to the oscillator during a boot-up phase of the phase locked loop device.

* * * * *